United States Patent [19]

Dingeman

[11] Patent Number: 4,928,289
[45] Date of Patent: May 22, 1990

[54] APPARATUS AND METHOD FOR BINARY DATA TRANSMISSION

[75] Inventor: Drake D. Dingeman, Springfield, Ohio

[73] Assignee: Systran Corporation, Dayton, Ohio

[21] Appl. No.: 286,186

[22] Filed: Dec. 19, 1988

[51] Int. Cl.⁵ .......................................... H04L 25/49
[52] U.S. Cl. ........................................ 375/20; 341/55
[58] Field of Search ............... 375/19, 17, 20, 25; 360/42, 43, 45, 40; 341/55, 71, 74

[56] References Cited

U.S. PATENT DOCUMENTS

| | | | |
|---|---|---|---|
| 3,696,401 | 10/1972 | Vance | 341/74 |
| 3,953,673 | 4/1976 | Dorward | 341/55 |
| 3,967,062 | 6/1976 | Dobias | 341/71 |
| 4,441,193 | 4/1984 | Bell | 341/71 |
| 4,507,621 | 3/1985 | Meyer | 375/17 |
| 4,620,310 | 10/1986 | Lvovsky et al. | 375/17 |
| 4,627,073 | 12/1986 | Shepperd et al. | 375/20 |
| 4,635,277 | 1/1987 | Blake et al. | 375/20 |
| 4,651,328 | 3/1987 | den Hollander et al. | 375/25 |
| 4,703,494 | 10/1987 | Ozaki et al. | 375/19 |

OTHER PUBLICATIONS

Hewlett Packard reprint from FOC 1984 proceedings pp. 173-175, "Use of Standard Modulation Codes for Fiber Optic Link Optimization".

Primary Examiner—Benedict V. Safourek
Assistant Examiner—Stephen Chin
Attorney, Agent, or Firm—Biebel, French & Nauman

[57] ABSTRACT

Apparatus and method for encoding data in an AC coupled bi-polar data transmission system. A stream of binary data is encoded to produce first and second binary code signals for transmission on a pair of transmission lines. Except as provided by the encoding technique, both binary code signals undergo a change of state for each data bit time. The signal on one line undergoes a transition for each bit time except when the data signal is changing from zero to one. The other transmission line undergoes a change of state for each bit time except when the data signal changes from one to zero. Decoding of the transmitted signals is achieved by applying both signals to an exclusive OR gate.

15 Claims, 3 Drawing Sheets

APPARATUS AND METHOD FOR BINARY DATA TRANSMISSION

BACKGROUND OF THE INVENTION

This invention relates to the field of binary data transmission and has particular application to multiprocessing systems wherein strings of binary data must be transmitted at high speed between different stations in the network. A number of different data encoding techniques are known in the prior art. Some of the better known codes are the NRZ Code wherein the data signal is high during the entire "mark" interval and is low during the entire "space" interval and the NRZI Code which has a transition for each "space" interval and no transition for "mark" intervals. Another prior art code is the RZ Code which returns to zero during each marking interval. Yet another self-clocking code is the Manchester Code wherein there is a positive transition for each "space" and a negative transition for each "mark". In a variation of the Manchester Code known as a Bi-Phase Mark code, each bit period begins with a transition. There is also a signal transition in the middle of each "mark" bit period. Other well-known codes are Bi-Phase Space, Miller and MFM codes. Each of these codes has associated disadvantages. The RZ, Bi-Phase Mark, Bi-Phase Space, Manchester and MFM codes all require a channel bandwidth which is twice the basic data frequency. This is a serious disadvantage in high speed communication. The NRZ, RZ and NRZI codes are not self-clocking, and are therefore difficult to handle at the receiving end. The NRZ, RZ, NRZI, and MFM codes are not AC coupled. In other words, the data signal may assume a given state for a period of time sufficient to require DC processing. The Miller Code has a problem in that self-clocking may be achieved only with the assistance of a phase locked loop. None of the above-noted codes provides an intermessage space which is unique from the message and which may be detected as such.

It is therefore seen that there is a need for an improved apparatus and method for data transmission which is self-clocking, AC coupled, able to provide a unique intermessage space, and operable at a bandwidth no greater than the data frequency.

SUMMARY OF THE INVENTION

This invention provides an improved apparatus and method for encoding data in an AC coupled bi-polar data transmission system. In accordance with this invention, a stream of binary data is encoded to produce first and second binary code signals for transmission on a pair of transmission lines. Except as provided by the encoding technique, both binary code signals undergo a change of state for each data bit time. One code signal undergoes no transition when the data signal changes from its first state to its second state (e.g. from zero to one) while the other code signal undergoes no change of state when the data signal transitions from its second state to its first state (e.g. from one to zero). This technique requires no more than one transition per data bit, thereby minimizing the bandwidth requirement for the transmission system. It also assures that each line will transition at least once every two data bits, thereby providing AC coupling.

A pair of code signals which have been encoded in accordance with this invention are easily decoded by applying them to an Exclusive OR gate. The clock signal may be regenerated at the receiver by generating a pulse whenever either of the first or second binary code signals changes state.

A transmission system in accordance with this invention may provide a unique intermessage space in the form of synchronizing pulses which change state in unison at a frequency equal to half the clock frequency. Circuitry may be provided in the receiver for identifying these synchronizing pulses and switching the state of a busy signal which enables the operation of a data shift register.

DESCRIPTION OF THE PREFERRED EMBODIMENT

Figure 1:
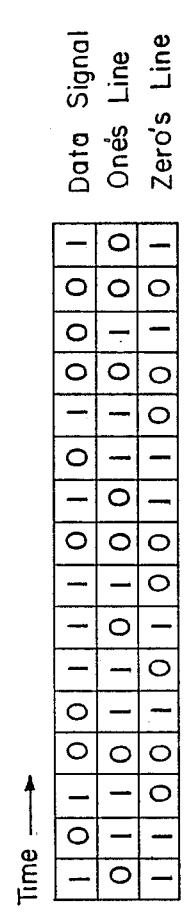
FIG. 1 is a matrix illustrating data encoding in accordance with this invention.

Binary data encoding in accordance with the present invention may be carried out as illustrated generally in FIG. 1. That figure illustrates a data signal comprising a string of zeros and ones. The apparatus of this invention uses the data signal to create first and second encoded signals. The first encoded signal is applied to a line $T_1$ (FIG. 4) which may be referred to as the ones line, while the second code signal is applied to a second line $T_0$ which may be referred to as the zeros line. The ones line transitions between one and zero at every bit time, except when the data signal changes from zero to one. The zeros line transitions between zero and one at every bit time, except when the data signal transitions from one to zero. Thus if there is a string of ones, the ones line will not transition for the first one of the string of ones but will transition every bit time thereafter. Similarly, the zeros line will not transition for the first zero of a string of zeros.

For the apparatus hereinafter illustrated, it is assumed that the data signal has an NRZ format, but this is not essential to the operation of the invention. Whatever the format of the data signal, however, it is necessary to provide the encoder with a binary data signal which alternates between a first state and a second state in a manner which can be recognized as a string of zeros and ones.

Figure 2:
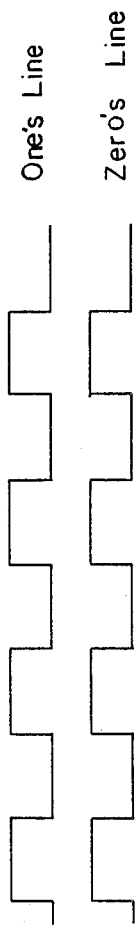
FIG. 2 illustrates a pair of synchronizing signals changing state in phase.
Figure 3:
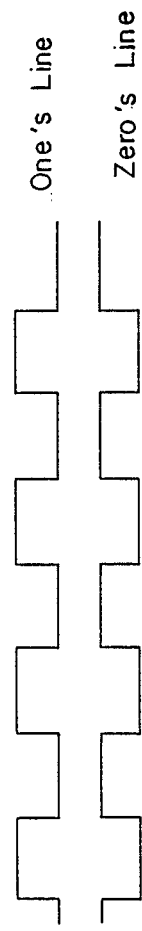
FIG. 3 illustrates a pair of synchronizing signals changing state out of phase.

In order to synchronize the data which is transmitted in accordance with this invention it is desirable to provide intermessage synchronizing signals. Such synchronizing signals may take the form of in-phase transitions of the ones line and the zeros line as illustrated in FIG. 2 or out-of-phase transitions of the ones line and zeros line, as illustrated in FIG. 3. In either event, the transitions of the ones line and zeros line occur in unison and at a frequency which is preferably half the frequency of the data signal.

Figure 4:
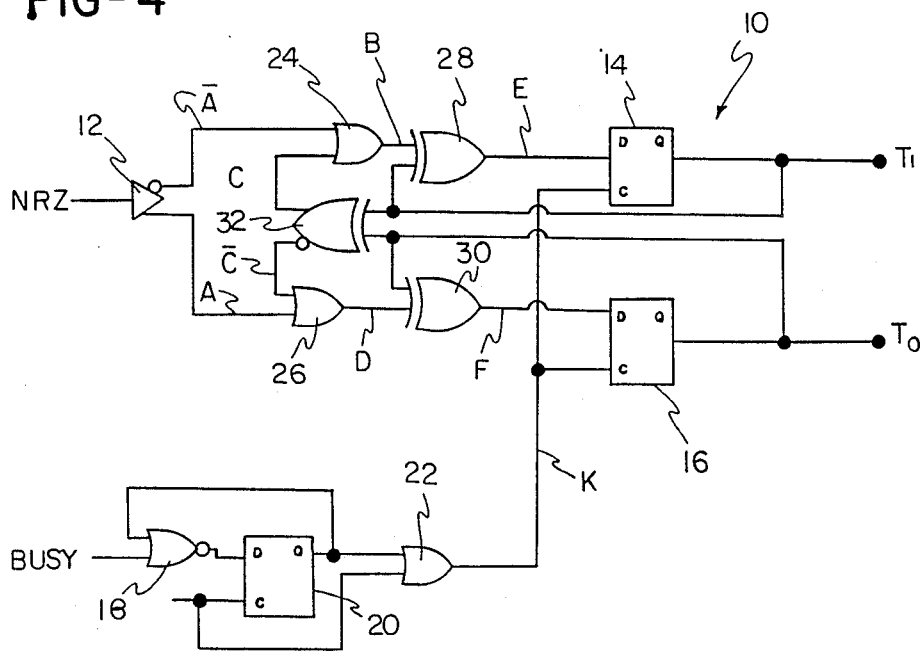
FIG. 4 is an electrical schematic diagram of encoding apparatus.

FIG. 4 illustrates encoder circuitry 10 for modulating a ones line and a zeros line as illustrated in FIGS. 1-3. For purposes of illustration, the ones line is identified by the reference designation $T_1$, while the zeros line is represented by the designation $T_0$. Input data is received on the input line designated NRZ and is applied to amplifier 12 for encoding. The encoded signals appear at lines E,F for application to the input terminals of D-type flip-flops 14,16. Flip-flops 14,16 are triggered by the leading edges of pulses applied to the flip-flop terminals by the line K. The pulses on line K are generated by an arrangement comprising NOR gate 18, flip-flop 20, and OR gate 22.

Encoder 10 receives a BUSY signal which is HI during message periods and LO during intermessage periods. The BUSY signal is applied to NOR gate 18 which provides an input to the D terminal of flip-flop 20. The output from flip-flop 20 is fed back to the input of NOR gate 18, so that NOR gate 18 and flip-flop 20 act as a divide-by-two network whenever the BUSY signal is LO. The system clock is applied to the clock terminal of flip-flop 20, and also to OR gate 22. The output of flip-flop 20 is likewise applied to the input of OR gate 22. The system clock is normally HI and goes LO at clock times so that the output from OR gate 22 provides a clock signal on line K which is half the frequency of the system clock when the BUSY signal is LO (during intermessage periods) and equal to the frequency of the system clock otherwise.

Figure 5:
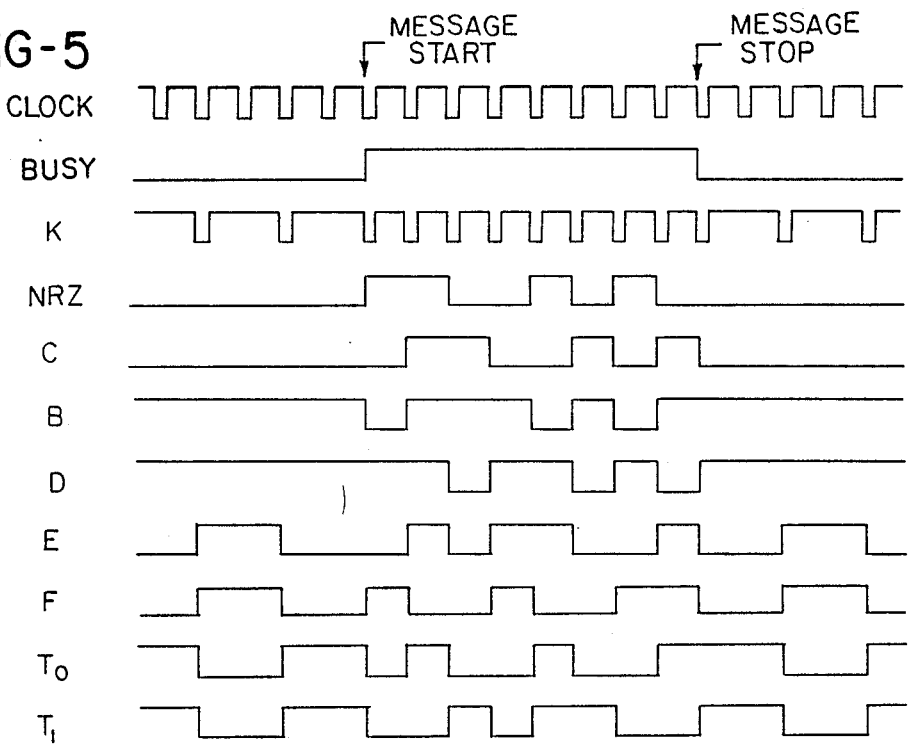
FIG. 5 is an illustration of wave forms associated with the apparatus of FIG. 4.

Encoding of the NRZ signal is accomplished by amplifier 12 in cooperation with OR gates 24,26 and Exclusive OR gates 28,30,32. The encoded signals are applied to lines E,F for shifting through flip-flops 14,16 to transmission lines $T_1$, $T_0$ respectively. As illustrated in FIG. 5, the wave forms on lines $T_1$, $T_0$ correspond to the wave forms on lines E,F respectively but are shifted in time by one effective clock period. As noted above, the effective clock period changes with the BUSY signal.

The code signals appearing on lines E,F are fed back to the input of Exclusive OR gate 32 after shifting through flip-flops 14,16. Exclusive OR gate 32 has two outputs (c,c̄), one of which (c̄ is inverted and applied to the input of OR gate 26. The other output from Exclusive OR gate 32 (c) is applied to the input of OR gate 24. OR gate 26 also receives an input from amplifier 12 on line A, while OR gate 24 receives an inverted output from amplifier 12 on line $\overline{A}$. Output signals from OR gates 24,26 are applied to the input terminals of Exclusive OR gates 28,30 respectively, together with feedback signals from transmission lines $T_1$, $T_0$.

The above-described circuit has the property that whenever the signal on NRZ goes LO and remains LO, the signals on transmission lines $T_1$, $T_0$ alternate in phase at the effective clock frequency. If this condition occurs while the BUSY line is LO, the in-phase transitions will occur at half the system clock frequency, thereby producing wave forms as illustrated in FIG. 2. If, on the other hand, the signal on line NRZ is held HI while the busy signal is LO, the signals on transmission lines $T_1$, $T_0$ will transition out-of-phase to produce wave forms as illustrated in FIG. 3.

It can be shown that the circuitry of FIG. 4 operates on data signals appearing on line NRZ to produce encoded output signals at lines $T_1$, $T_0$ in accordance with the Boolean equations:

$$T_1 = \overline{T_{0p} + T_{1p} + N} + T_{1p} + \overline{T_{1p} + T_{0p} + \overline{N}}$$

$$T_0 = \overline{T_{1p} + T_{0p}} + \overline{T_{0p} + \overline{N}} + \overline{T_{1p} + T_{0p} + N}$$

where: N is the data signal
$T_{0p}$ is the immediately preceding value of $T_0$
$T_{1p}$ is the immediately preceding value of $T_1$, it being understood that the values of $T_1$ and $T_0$ are delayed with respect to the values of N by one effective clock period.

FIG. 5 illustrates a series of typical wave forms associated with a circuit of the type illustrated in FIG. 4. It will be seen that all wave forms have NRZ format. For the purposes of this illustration it is assumed that the data signal consists of the 8-bit string 11001010 and that the signal on line NRZ during the intermessage period is clamped to zero. A study of these wave forms will show that when NRZ changes from a one to a zero, the signal on line D goes LO and the signal on line F assumes the same state as signal on line $T_0$. Thus there is no change in the state of the signal on line $T_0$ at the next clock period. Similarly, when NRZ goes from zero to one, line B goes low, and the signal on line E assumes the same state as the signal on line $T_1$. Thus $T_1$ will not transition at the next clock interval.

Normally the first message bit on NRZ (start bit) is a one. It is desirable to program the synchronizing signals so that $T_0$ and $T_1$ are both zero at that time. This causes an immediate transition in the signal on line F and no transition on line E. This will be reflected by the states of $T_0$ and $T_1$ respectively at the next clock interval. The last bit of an NRZ string is normally a zero, and line NRZ is held in that state until the next string.

Figure 6:
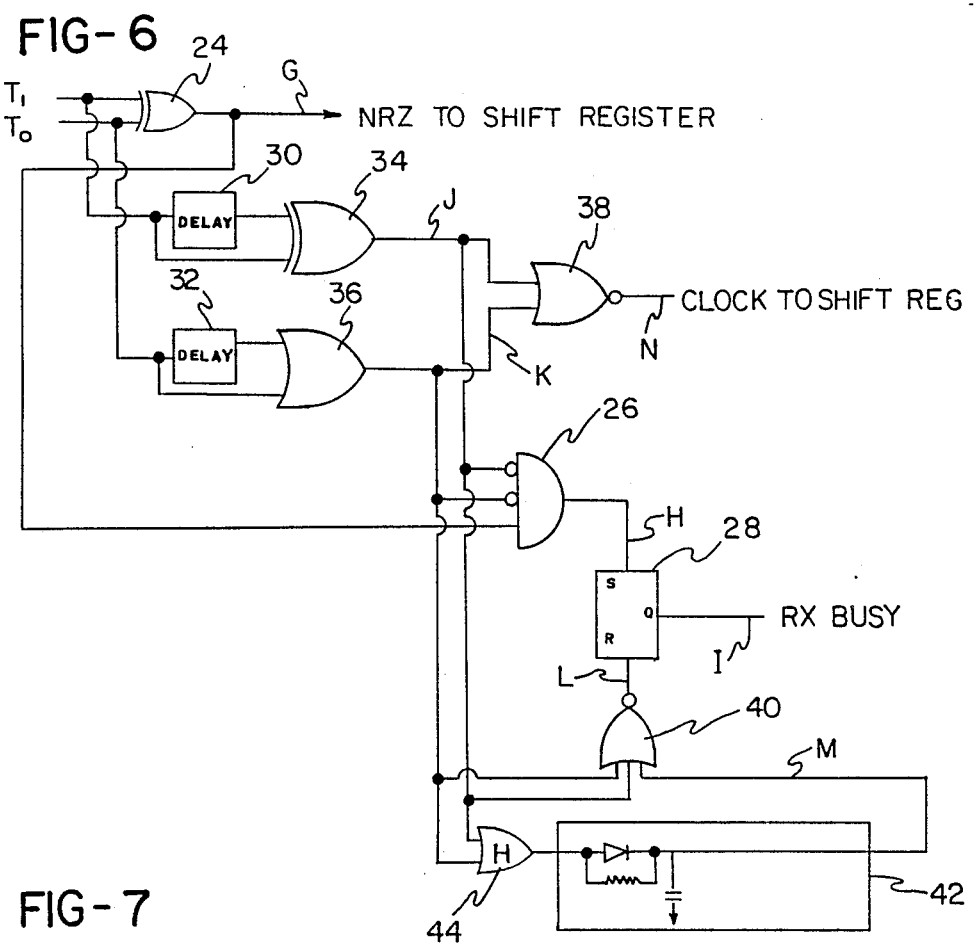
FIG. 6 is an electrical schematic diagram of decoding apparatus.

FIG. 6 illustrates a receiver for receiving and decoding the signals appearing on lines $T_1$, $T_0$. The primary element of receiver is an exclusive OR gate 24 which decodes the signals on transmission lines $T_1$, $T_0$ to produce a decoded NRZ signal on line G. This signal is applied to a data receiving shift register (not illustrated) and to the input side of AND gate 26. The output of AND gate 26 is applied to line H for setting flip-flop 28. Flip-flop 28 produces a BUSY signal on line I which enables shifting of NRZ data into the receiver's shift register. Line I goes LO during intermessage periods, and NRZ data shifting discontinues at that time.

System clock pulses are regenerated by delay circuits 30,32, Exclusive OR gates 34,36 and NOR gate 38. Delay circuit 40 and Exclusive OR gate 34 function as an edge to pulse converter for signals on line $T_1$. Delay circuit 32 and Exclusive OR gate 36 function as an edge to pulse converter for signals appearing on line $T_0$. The operation of these two edge to pulse converters is identical. When a pulse appears on line $T_1$, it passes through exclusive OR gate 34 and appears immediately on line J. Delay circuit 30 has a delay of approximately one-half bit time. At the end of this delay both inputs to Exclusive OR gate 34 are HI, and the signal on line J goes LO. If the signal on line $T_1$ is a pulse of one bit-width, then the signal on line J remains LO for one-half bit time, after which the continuing output from delay circuit 30 causes line J to go HI. The HI condition persists for another half-bit period. A single edge to pulse converter replicates the effective clock of line K but omits pulses for bit times associated with non-transitions of the associated transmission line. Thus two edge to pulse converters are required for complete recovery of the effective clock.

As stated above, the NRZ signal on line G is applied to the input side of AND gate 26. Signals on lines J and K from the two edge to pulse converters are inverted and likewise applied to AND gate 26. This causes the BUSY signal on line I to go HI whenever the NRZ signal on line G is HI and the clock signals on lines J and K are both LO. The BUSY signal on line I stays HI as long as the reset line L remains LO.

Line L carries the output from NOR gate 40. NOR gate 40 receives input signals from lines J and K, as well as an input signal from line M. Line M carries the output from a fast attack slow decay circuit 42. Clock signals on lines J and K are applied to OR gate 44, which is connected to the input terminal of circuit 42. Circuit 42 has a decay time of about one and one-half bit times. During message periods, one or the other of lines J,K will be HI every bit time. During intermessage times, lines J,K go LO long enough to permit decaying of the output from circuit 42. This causes the signal on line L to go HI and reset flip-flop 28, thereby switching off the busy signal on line I.

Figure 7:
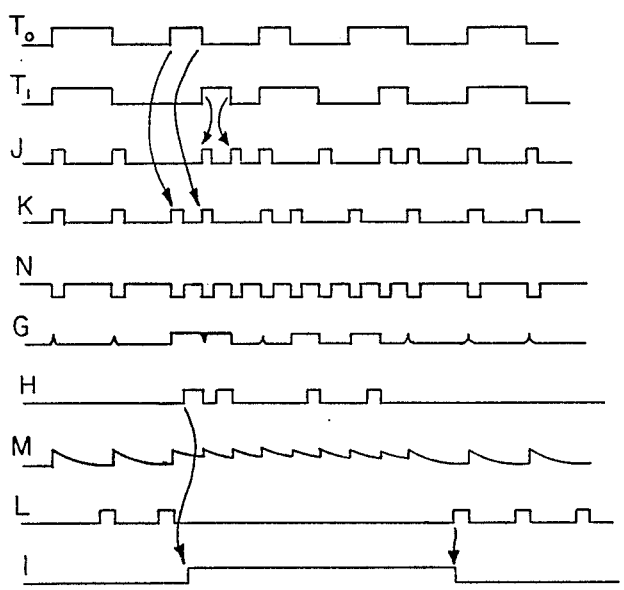
FIG. 7 is illustration of wave forms associated with the apparatus of FIG. 6.

FIG. 7 illustrates the wave forms appearing on lines J—N of receiver, along with the wave forms on line $T_0$, $T_1$.

In accordance with the method of this invention, data which is to be transmitted to a receiver is assembled as a binary string of ones and zeros. This binary data is applied to a circuit having two outputs. One of these outputs is forced to change state for every bit of the data signal except the ones which immediately follow a zero. The other line is forced to change state for every bit of the data signal except for zeros which immediately follow a one. The method of the invention further contemplates transmitting the two encoded signals to a receiving location and combining them on an Exclusive OR basis to recreate the input data stream.

While the method herein described, and the form of apparatus for carrying this method into effect, constitute preferred embodiments of this invention, it is to be understood that the invention is not limited to this precise method and form of apparatus, and that changes may be made in either without departing from the scope of the invention, which is defined in the appended claims.

What is claimed is:

1. Encoding apparatus for encoding a data signal comprising a stream of bits each of which is characterized by a first or a second binary state, said apparatus comprising:

means for accepting said data signal, first encoding means responsive to the accepted data signal for generating a first binary code signal which undergoes a change of state for each consecutive bit in said data signal except those bits which have said second state and immediately follow a bit having said first state, and second encoding means responsive to the accepted data signal for generating a second binary code signal which undergoes a change of state for each consecutive bit in said data signal except those bits which have said first state and immediately follow a bit having said second state.

2. Apparatus according to claim 1 further comprising synchronizing means for causing said first and second encoding means to operate at a first frequency while encoding said data signal and at second frequency, different from said first frequency, when said data signal is not present.

3. Apparatus according to claim 2 wherein said first and second encoding means comprise means for causing said first and second binary code signals to change state in unison when said data signal is not present.

4. Apparatus according to claim 3 further comprising a commonly shared Exclusive OR gate, means for applying said first and second binary code signals to the input side of said Exclusive OR gate and feedback means for connecting the output of said exclusive OR gate to the input sides of said first and second encoding means.

5. Apparatus according to claim 3 wherein said synchronizing means comprises means for causing said second frequency to be half of said first frequency.

6. Apparatus according to claim 1 wherein said first encoding means comprises means for generating said first binary code signal by processing said data signal in accordance with the Boolean equation:

$$T_1 = \overline{T_{0p} + T_{1p}} + \overline{N + T_{1p}} + \overline{T_{1p} + T_{0p} + N}$$

and said second encoding means comprises means for generating said second binary code signal by processing said data signal in accordance with the Boolean equation:

$$T_0 = \overline{T_{1p} + T_{0p}} + \overline{T_{0p} + \overline{N}} + \overline{T_{1p} + T_{0p} + N}$$

where:

$N$ is the data signal
$T_{0p}$ is the immediately preceding value of $T_0$
$T_{1p}$ is the immediately preceding value of $T_1$
$T_0$ is the second binary code signal
$T_1$ is the first binary code signal 7. A data transmission system comprising:

accepting means for accepting a data signal comprising a series of bits each of which is characterized by a first or a second binary state, first encoding means responsive to the accepted data signal for generating a first binary code signal which undergoes a change of state for each consecutive bit in said data signal except those bits which have said second state and which immediately follow a bit having said first state, and second encoding means responsive to the accepted data signal for generating a second binary code signal which undergoes a change of state for each consecutive bit in said data signal except those bits which have said first state and which immediately follow a bit having said second state, transmitting means for separately transmitting said first and second binary code signals, receiving means for receiving said first and second binary code signals and creating a binary output signal which is the Exclusive OR of said first and second binary code signals.

8. Apparatus according to claim 7 further comprising synchronizing means for causing said first and second encoding means to operate at a first frequency while encoding said data signal and at second frequency, different from said first frequency, during periodic intervals in said data signal.

9. Apparatus according to claim 8 wherein said first and second encoding means comprise means for causing said first and second binary code signals to change state in unison during said periodic intervals.

10. Apparatus according to claim 9 wherein said receiving means comprises clock pulse regenerating means for producing a regenerated clock pulse whenever either of said first or second binary code signals changes state.

11. Apparatus according to claim 10 wherein said receiving means comprises means for generating a BUSY signal having one binary state whenever said regenerated clock pulses are occurring at said first frequency and a different binary state whenever aid regenerated clock pulses are occurring at said second frequency.

12. Method of transmitting binary data comprising the steps of:

assembling said binary data into a string of ones and zeros generating a first binary code string having a bit corresponding to each bit in said data string, the successive bits in said first binary code string changing state between zero and one except when a corresponding consecutive bit pair in said data string changes state from zero to one, generating a second binary code string having a bit corresponding to each bit in said data string, the successive bits in said second binary code string changing state between zero and one except when a corresponding consecutive bit pair in said data string changes state from one to zero and, separately transmitting said first and second binary code strings.

13. Method according to claim 12 further comprising the step of generating an electrical clock signal, said data strings and said code strings each being generated as electrical signals clocked by said clock signal and having a NON Return to Zero format.

14. Method according to claim 13 further comprising the steps of generating a pair of synchronizing signals having pulses which occur in unison at a frequency different from the frequency of said clock signal, and periodically interposing said synchronizing signals into the electrical signals corresponding to said first and second code strings.

15. Method according to claim 14 wherein the frequency of said synchronizing signals is one-half the frequency of said clock signal.

* * * * *